US011444153B2

(12) United States Patent
Zhang et al.

(10) Patent No.: US 11,444,153 B2
(45) Date of Patent: Sep. 13, 2022

(54) METHOD OF FORMING STRESS MEMORIZATION LAYER ON BACKSIDE OF SEMICONDUCTOR SUBSTRATE AND SEMICONDUCTOR DEVICE THEREOF

(71) Applicant: APPLIED Materials, Inc., Santa Clara, CA (US)

(72) Inventors: Qintao Zhang, Mt. Kisco, NY (US); Wei Zou, Lexington, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 392 days.

(21) Appl. No.: 16/542,667

(22) Filed: Aug. 16, 2019

(65) Prior Publication Data
US 2021/0050411 A1 Feb. 18, 2021

(51) Int. Cl.
*H01L 29/06* (2006.01)
*H01L 21/265* (2006.01)

(52) U.S. Cl.
CPC .... *H01L 29/0603* (2013.01); *H01L 21/26506* (2013.01)

(58) Field of Classification Search
CPC ......... H01L 21/26506; H01L 21/26513; H01L 21/302; H01L 21/02002; H01L 21/02016; H01L 21/02667
See application file for complete search history.

(56) References Cited

U.S. PATENT DOCUMENTS

| | | | |
|---|---|---|---|
| 2008/0171423 A1* | 7/2008 | Leong | H01L 21/84 438/486 |
| 2020/0118822 A1 | 4/2020 | Falk et al. | |

OTHER PUBLICATIONS

Kwan-Yong Lim et al., "Novel stress-memorization-technology (SMT) for high electron mobility enhancement of gate last high-k/ metal gate devices," 2010 International Electron Devices Meeting, 2010, p. 10.1.1-10.1.4, doi: 10.1109/IEDM.2010.5703332. (Year: 2010).*
"Characterization of Highly Strained nFET Device Performance and Channel Mobility with SMT", Authors: Chih-Cheng Lu,z Jiun-Jia Huang, Wun-Cheng Luo, Tuo-Hung Hou, and Tan-Fu Lei; Department of Electronics Engineering and Institute of Electronics, National Chiao-Tung University, Hsin-Chu 300, Taiwan; Journal of the Electrochemical Society, 157 (7) H705-H710 (2010), 6 pages.

* cited by examiner

*Primary Examiner* — John P. Dulka
(74) *Attorney, Agent, or Firm* — KDB Firm PLLC

(57) ABSTRACT

Embodiments herein are directed to methods and devices having a stress memorization layer along a side of a substrate. In some embodiments, a method may include providing a substrate having a first main side opposite a second main side, implanting the second main side of the substrate to form an amorphous implant area, forming a stress liner over the second main side of the substrate, and annealing the stress liner to form a stress memorization layer in the amorphous implant area.

19 Claims, 5 Drawing Sheets

METHOD OF FORMING STRESS MEMORIZATION LAYER ON BACKSIDE OF SEMICONDUCTOR SUBSTRATE AND SEMICONDUCTOR DEVICE THEREOF

FIELD OF THE DISCLOSURE

The present embodiments relate to semiconductor devices, and more particularly, to semiconductor substrates including a stress memorization layer.

BACKGROUND OF THE DISCLOSURE

Integrated circuits are made possible by processes which produce intricately patterned material layers on substrate surfaces. Producing patterned material on a substrate requires controlled methods for depositing material to be patterned. Physical, chemical, and plasma-enhanced deposition techniques are used to deposit different materials on substrates. However, different materials have different characteristics, which can lead to different effects on the stack of layers or the substrate itself. For example, as structures such as 3-D NANDs are stacked higher, stresses in the substrate increase, sometimes causing wafer directional bowing. When the substrate is deformed, lithography alignment becomes challenging, resulting in lower quality devices and increased costs.

SUMMARY OF THE DISCLOSURE

In view of the foregoing, what is needed are approaches for forming semiconductor substrates including a stress memorization layer. In one approach, a method includes providing a substrate having a first main side opposite a second main side, implanting the second main side of the substrate to form an amorphous implant area, forming a stress liner over the second main side of the substrate, and annealing the stress liner to form a stress memorization layer in the amorphous implant area.

In another approach, a method for forming a semiconductor device may include providing a stack of layers atop a first main side of a substrate, implanting a second main side of the substrate to form an amorphous implant area, forming a stress liner along the second main side of the substrate, annealing the stress liner to form a stress memorization layer in the amorphous implant area along the second main side of the substrate, and removing the stress liner from along the stress memorization layer and from along the second main side of the substrate.

In yet another approach, a semiconductor device may include a stack of layers disposed along a first main side of a substrate, and a stress memorization layer disposed along a second main side of the substrate.

Figure 1:
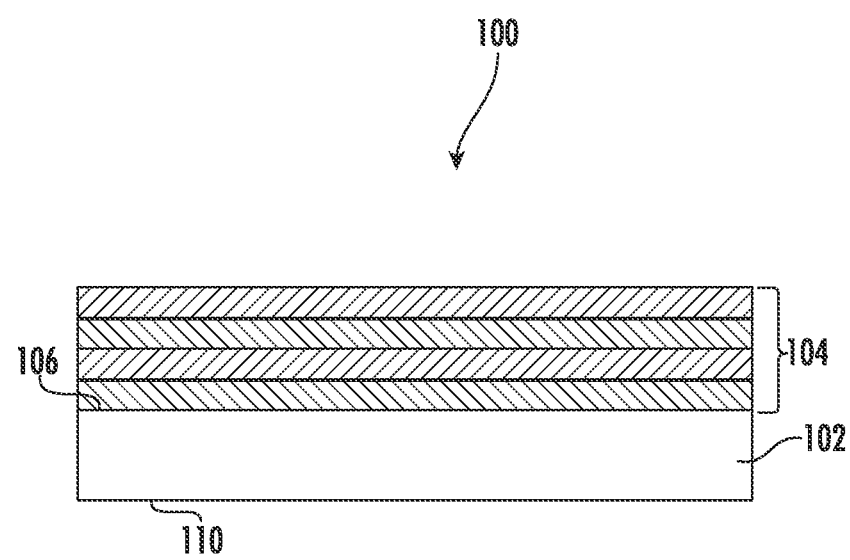
FIG. 1 depicts a side cross-sectional view of a semiconductor device including a stack of layers atop a substrate in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and semiconductor devices in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

Embodiments herein provide stress memorization techniques for directional stress generation. The generated stress can remain in one or more layers of the device, such as the substrate, even following a high-temperature process. This approach is beneficial for 3D NAND applications, for example.

Turning now to FIG. 1, there is shown a cross-sectional view of a semiconductor device 100 (hereinafter "device") according to embodiments of the disclosure. The device 100 includes a wafer or substrate 102, and a stack of layers 104 formed along a first main side 106 of the substrate 102. Although non-limiting, the stack of layers 104 may include alternating layers of insulating, semiconducting, and metallic layers such as $SiO_2$, SiN, a-Si, and poly-Si. The stack of layers 104 may be deposited atop the substrate 102 using known techniques.

The term "substrate" as used herein is intended to include a semiconductor substrate or semiconductor wafer, a semiconductor epitaxial layer deposited or otherwise formed on a semiconductor substrate and/or any other type of semiconductor body, and all such structures are contemplated as falling within the scope of the present embodiments. For example, the substrate 102 may comprise a semiconductor wafer (e.g., silicon, SiGe, or an SOI wafer) or one or more die on a wafer, and any epitaxial layers or other type semiconductor layers formed there over or associated therewith. A portion or entire substrate 102 may be amorphous, polycrystalline, or single-crystalline. As will be described in further detail herein, the substrate 102 may contain regions with strain and regions without strain therein. More specifically, the substrate 102 may include regions of tensile strain and/or compressive strain along a second main side 110 of the substrate 102.

As used herein, the term "depositing" may include any now known or later developed techniques appropriate for the material to be deposited. For example, depositing may include: chemical vapor deposition (CVD), low-pressure CVD (LPCVD), plasma-enhanced CVD (PECVD), semi-atmosphere CVD (SACVD) and high density plasma CVD (HDPCVD). Depositing may further include: rapid thermal CVD (RTCVD), ultra-high vacuum CVD (UHVCVD), limited reaction processing CVD (LRPCVD), metal-organic CVD (MOCVD), sputtering deposition, and ion beam deposition. Depositing may further include: electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 2A:
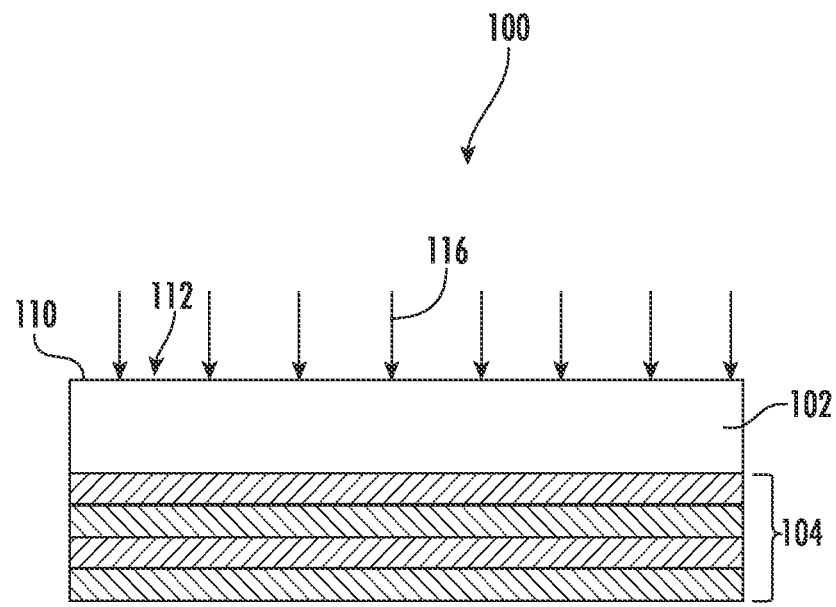
FIG. 2A depicts a side cross-sectional view of an implant for forming an amorphous implant area in accordance with embodiments of the present disclosure.
Figure 2B:
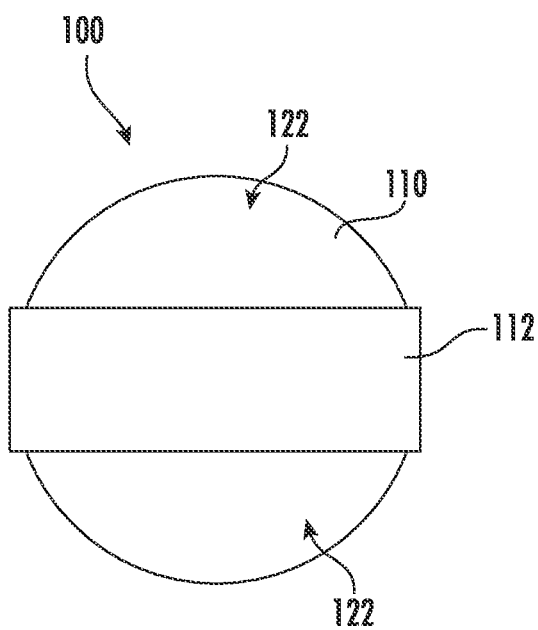
FIG. 2B depicts a bottom view of the semiconductor device including the amorphous implant area in accordance with embodiments of the present disclosure.

As demonstrated in FIGS. 2A-2B, an amorphous implant area 112 (hereinafter "implant area") may be formed along the second main side 110 of the substrate 102. For example, an ion implant 116 may be performed to the second main side 110 to amorphize the surface thereof. In some embodiments, the ion implant 116 may be performed by a medium or high-current ion implanter capable of forming the implant area 112 along just a portion of the second main side 110. As shown, one or more portions 122 of the second main side 110 may not be impacted by the ion implant 116. Although the implant area 112 is shown as a rectangle, it will be appreciated that the implant area 112 is not limited to any particular shape or size.

In various embodiments, the ion implant 116 to the second main side 110 of the substrate 102 may be performed before or after the stack of layers 104 is formed atop the first main side 106 of the substrate 102. In yet other embodiments, the ion implant 116 may be performed to the second main side 110 of the substrate 102 as the stack of layers 104 is being deposited on the first main side 106 of the substrate 102. In order to perform the ion implant 116 to the second main side 110 of the substrate 102, the substrate 102 may be processed in a chamber upside down compared to conventional operation. In some embodiments, the substrate 102 may be processed in a dedicated chamber or processing tool for back-side implantation.

In some embodiments, a depth or thickness of the amorphized implant area 112 is controlled by parameters of the ion implant 116, such as implant energy, implant species, and implant dosage, etc. Although non-limiting, the implant species may include silicon (Si), germanium (Ge), and/or tin (Sn). In other embodiments, heavier implant species may be used. For example, in some embodiments, the ion implant 116 utilizes other implant species, such as Ar, Xe, As, P, In, other suitable implant species, or combinations thereof. In some embodiments, the ion implant 116 implants species at an implant energy in a range from about 20 KeV to about 40 KeV. In some embodiments, the ion implant 116 implants species at a dosage ranging in a range from about $7 \times 10^{14}$ atoms/cm$^2$ to about $1.5 \times 10^{15}$ atoms/cm$^2$, depending on the implantation temperature. In some embodiments, the implant temperature is in a range from about −100° C. to about 25° C. Embodiments herein are not limited in this context.

Figure 3A:
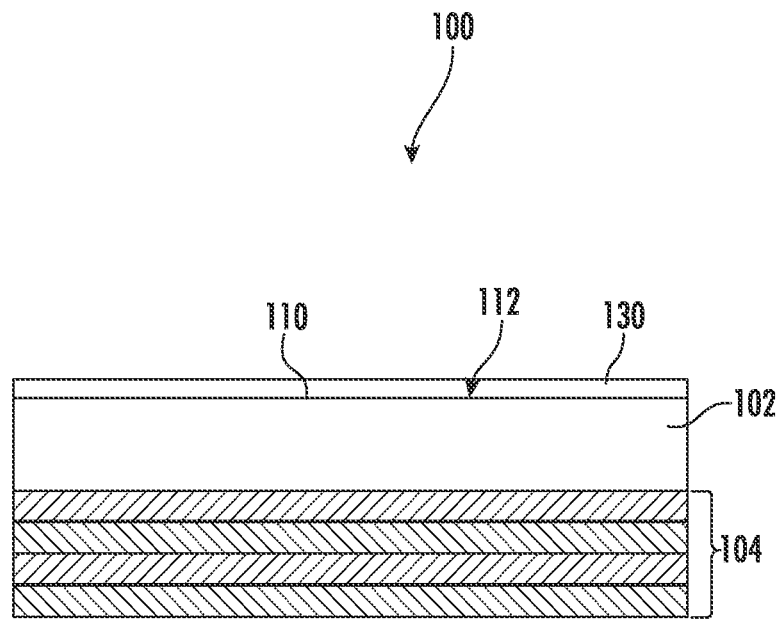
FIG. 3A depicts a side cross-sectional view of a stress liner formed over a second main side of the semiconductor device in accordance with embodiments of the present disclosure.
Figure 3B:
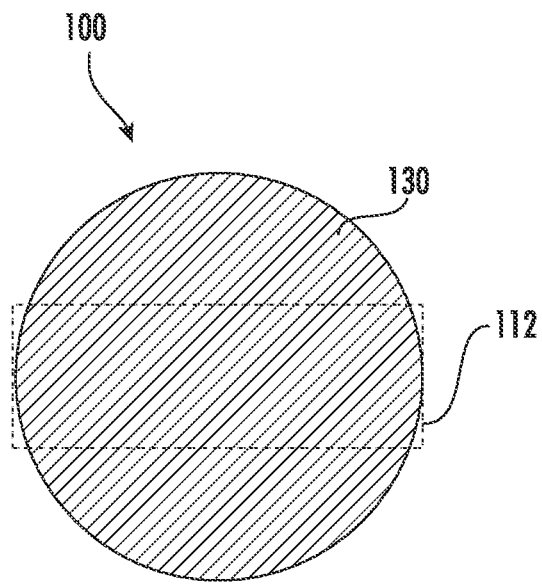
FIG. 3B depicts a bottom view of the stress liner formed over the second main side of the semiconductor device in accordance with embodiments of the present disclosure.

As shown in FIGS. 3A-B, a stress layer or stress liner 130 may then be formed along the second main side 110 of the substrate 102, including over the implant area 112. The stress liner 130 may be deposited along the second main side 110 of the substrate 102 to compensate for stresses in the substrate 102 caused, for example, by differing tensile and compressive stresses in the stack of layers 104. In various embodiments, the stress liner 130 may be a tensile stress liner or a compressive stress liner. The stress liner 130 may be a silicon nitride layer or other tensile film on the back side of the substrate 102, resulting in the device 100 shown in FIGS. 3A-3B. Other tensile films may include SACVD oxide and LPCVD SiON. Embodiments herein are not limited in this context.

In order to deposit the stress liner 130 on the second main side 110 of the substrate 102, the substrate 102 may be processed in a chamber upside down compared to conventional operation. In some embodiments, the substrate 102 may be processed in a dedicated chamber or processing tool for back-side deposition. The stress liner 130 may be in contact with the substrate 102. In some embodiments, the stress liner 130 may be deposited by LPCVD. The stress liner 130 may be deposited to any thickness. Furthermore, multiple stress liners may be deposited in other embodiments.

In some embodiments, the stress liner 130 may be deposited after the substrate 102 is characterized by a bow exceeding a threshold value. Wafer bow may be the deviation of the center point of a median surface of an unclamped wafer from the median surface to the reference plane. The threshold value may be a value from +/−50 µm to +/−100 µm, from +/−100 µm to +/−150 µm, from 150 µm to 200 µm, or greater than 200 µm. For example, the threshold value may be 100 µm. After depositing the stress liner 130, the substrate 102 may be characterized by a bow not exceeding the threshold value. In some embodiments, the wafer bow may be reduced by 100%, by 90%, by 80%, by 70%, by 60%, by 50%, etc., compared to the bow before depositing the stress liner 130. In other embodiments, depositing the stress liner 130 may result in a bow in the substrate 102 in an opposite direction compared to before the stress liner 130 was deposited. Because depositing the stress liner 130 may be based on a threshold value for wafer bow that may adversely affect deposition uniformity or other properties, depositing the stress liner 130 may occur after any one of the stack of layers 104 is deposited.

Figure 4A:
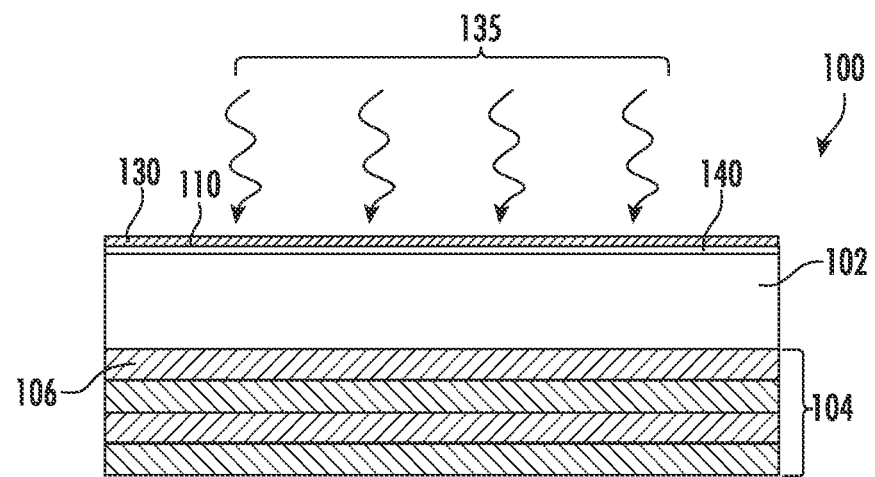
FIG. 4A depicts a side cross-sectional view of an anneal for forming a stress memorization layer in accordance with embodiments of the present disclosure.
Figure 4B:
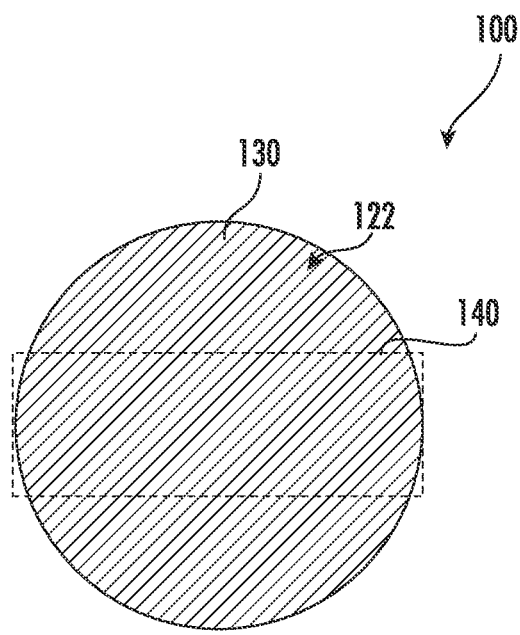
FIG. 4B depicts a bottom view of the semiconductor device during the anneal in accordance with embodiments of the present disclosure.

As demonstrated in FIGS. 4A-AB, an annealing process 135 may then be performed on the device 100. The annealing process 135 may impact the stress liner 130 to form a stress memorization layer (SML) 140 along the second main side 110 of the substrate 102. More specifically, the annealing process 135 may cause the amorphous implant area 112 to re-crystallize, forming the SML 140. This process is also known as solid-phase epitaxy regrowth (SPER). In some embodiments, the SPER may be caused by a flash or laser anneal, which doesn't exceed thermal limitations on the first main side 106 of the substrate 102. The SML 140 may include epitaxial Si, Ge, and/or Sn. As shown, the SML 140 may be formed along just a portion of the second main side 110 of the substrate 102, i.e., in approximately the same area defined by the implant area 112. For example, one or more portions 122 of the second main side 110 may not include the SML 140. As a result, the SML 140 may be provided just in those areas of the substrate 102 where it is needed to address wafer bowing.

In some embodiments, the annealing process 135 is a microwave annealing (MWA) process, a rapid thermal annealing (RTA) process, a millisecond thermal annealing (MSA) process (for example, a millisecond laser thermal annealing process), or a micro-second thermal annealing (μSA) process. In some embodiments, the annealing process includes a pre-heat operation which minimizes or even eliminates end of range (EOR) defects, which are the remained defects at the amorphous/crystalline interface. The pre-heat operation is performed at a temperature from about 200° C. to about 700° C., in accordance with some embodiments. The pre-heat operation is performed in a range from about 10 seconds to about 10 minutes, in various embodiments.

Figure 5A:
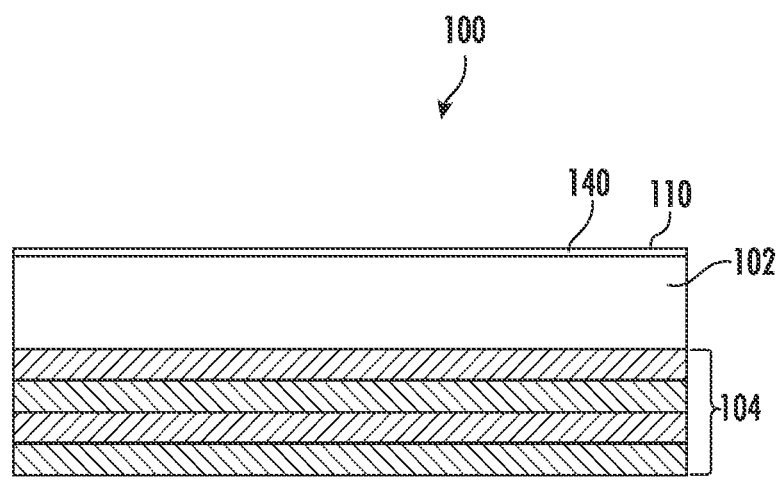
FIG. 5A depicts a side cross-sectional view of the semiconductor device following removal of the stress liner in accordance with embodiments of the present disclosure.
Figure 5B:
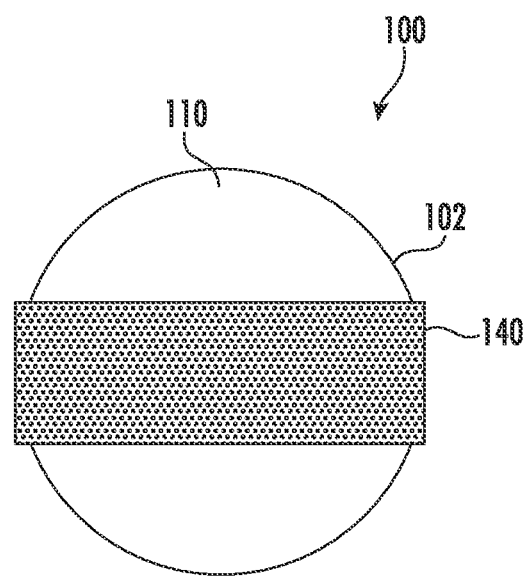
FIG. 5B depicts a bottom view of the semiconductor device following removal of the stress liner in accordance with embodiments of the present disclosure.

Next, as shown in FIGS. 5A-5B, the stress liner 130 may be removed from the second main side 110 of the substrate 102 after the SML 140 is formed. In some embodiments, the stress liner 130 may be removed using one or more etch processes. For example, the etching process may be performed by wet etching, such as by using phosphoric acid or hydrofluoric acid, or by a combination of dry etching and wet etching. As shown, the etch is selective to the second main side 110 of the substrate 102 and to the SML 140.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

In view of the foregoing, at least the following advantages are achieved by the embodiments disclosed herein. A first advantage includes increased device reliability due to mitigation of wafer bowing. A second advantage includes a longer-lasting stress memorization layer following high-temperature processes. A third advantage includes selective creation of the stress memorization layer along the backside of the wafer to compensate wafer directional bowing. The stress memorization layer may be formed just in those areas of the substrate where it's needed.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Furthermore, identification references (e.g., primary, secondary, first, second, third, fourth, etc.) are not intended to connote importance or priority, but are used to distinguish one feature from another.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative methods described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. For example, the herein described process sequence of performing the implant process, formation of stress film, annealing, and removal of the stress film can be repeated a number of times to create multiple stress memorization layers or areas.

In addition, not all illustrated acts or events may be required to implement a methodology in accordance with the present disclosure. Furthermore, the methods may be implemented in association with the formation and/or processing of structures illustrated and described herein as well as in association with other structures not illustrated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. A method, comprising:
   providing a substrate having a first main side opposite a second main side;
   depositing a stack of layers atop the first main side of the substrate;
   implanting the second main side of the substrate to form an amorphous implant area;
   forming a stress liner over the second main side of the substrate; and
   annealing the stress liner to form a stress memorization layer in the amorphous implant area.

2. The method of claim 1, further comprising removing the stress liner after the stress memorization layer is formed.

3. The method of claim 1, wherein the stack of layers is formed atop the first main side of the substrate before the second main side of the substrate is implanted.

4. The method of claim 1, wherein the stress memorization layer is formed along just a portion of the second main side of the substrate.

5. The method of claim 1, wherein the stress memorization layer is formed by a solid-phase epitaxy regrowth process.

6. The method of claim 1, wherein implanting the second main side of the substrate to form the amorphous implant area comprises implanting the second main side with germanium, silicon, or tin.

7. The method of claim 1, further comprising etching the stress liner to remove the stress liner over the stress memorization layer.

8. A method for forming a semiconductor device, comprising:
   depositing a stack of layers atop a first main side of a substrate;
   implanting a second main side of the substrate to form an amorphous implant area;
   forming a stress liner along the second main side of the substrate;
   annealing the stress liner to form a stress memorization layer in the amorphous implant area along the second main side of the substrate; and
   removing the stress liner from along the stress memorization layer and from along the second main side of the substrate.

9. The method of claim 8, wherein the stack of layers is formed atop the first main side of the substrate before the second main side of the substrate is implanted.

10. The method of claim 8, wherein the stack of layers is formed atop the first main side of the substrate after the second main side of the substrate is implanted.

11. The method of claim 8, wherein the stress memorization layer is formed along just a portion of the second main side of the substrate.

12. The method of claim 8, wherein just a portion of the second main side of the substrate is implanted to form the amorphous implant area.

13. The method of claim 8, wherein the stress memorization layer is formed by a solid-phase epitaxy regrowth process.

14. The method of claim 8, wherein implanting the second main side of the substrate to form the amorphous implant area comprises implanting the second main side with germanium, silicon, or tin.

15. The method of claim 8, further comprising etching the stress liner to remove the stress liner from over the stress memorization layer.

16. A semiconductor device, comprising:
   a stack of layers formed atop a first main side of a substrate; and
   a stress memorization layer formed in a second main side of the substrate, wherein the second main side of the substrate is a backside of the substrate.

17. The semiconductor device of claim 16, wherein the stress memorization layer is formed along just a portion of the second main side of the substrate.

18. The semiconductor device of claim 16, wherein the stress memorization layer is a solid-phase epitaxial layer.

19. The semiconductor device of claim 16, wherein the stress memorization layer includes germanium, silicon, or tin.

* * * * *